(12) United States Patent
Lee et al.

(10) Patent No.: US 6,365,938 B2
(45) Date of Patent: *Apr. 2, 2002

(54) INTEGRATED CIRCUIT DEVICES THAT USE ANTIPARALLEL DIODES TO REDUCE DAMAGE DURING PLASMA PROCESSING

(75) Inventors: Ki-Young Lee; Dong-Gi Choi, both of Kyungki-do (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/333,184

(22) Filed: Jun. 14, 1999

(30) Foreign Application Priority Data

Sep. 16, 1998 (KR) .............................. 98-38307

(51) Int. Cl.$^7$ .............................................. H01L 29/78
(52) U.S. Cl. ..................... 257/355; 257/360; 257/363
(58) Field of Search .......................... 257/355, 363, 257/356, 360, 357, 358

(56) References Cited

U.S. PATENT DOCUMENTS

| | | | | |
|---|---|---|---|---|
| 5,422,507 A | * | 6/1995 | Wanlass | 257/355 |
| 5,519,242 A | * | 5/1996 | Avery | 257/356 |
| 5,587,598 A | * | 12/1996 | Hatanaka | 257/355 |
| 5,682,049 A | * | 10/1997 | Nguyen | 257/363 |
| 5,731,600 A | * | 3/1998 | Codama et al. | 257/59 |
| 6,060,752 A | * | 5/2000 | Williams | 257/355 |
| 6,060,753 A | * | 5/2000 | Campardo et al. | 257/369 |
| 6,091,114 A | * | 7/2000 | Mogul et al. | 257/360 |

FOREIGN PATENT DOCUMENTS

| | | | | |
|---|---|---|---|---|
| JP | 409045905 A | * | 2/1997 | H01L/29/866 |

* cited by examiner

*Primary Examiner*—Matthew Smith
*Assistant Examiner*—Renzo N. Rocchegiani
(74) *Attorney, Agent, or Firm*—Myers Bigel Sibley & Sajovec

(57) ABSTRACT

An integrated circuit includes first and second diodes that are electrically connected to a conductive line in antiparallel, to dissipate both positive and negative charges on the conductive line during plasma processing. The integrated circuit also includes a fuse for disconnecting one of the first and second diodes from the conductive line after the plasma processing, to thereby allow conduction of one of positive and negative charge on the conductive line after the plasma processing. Accordingly, integrated circuits are fabricated by forming a conductive line on an integrated circuit substrate and first and second diodes in the integrated circuit substrate that are electrically connected to the conductive line in antiparallel. Then, plasma processing is performed on the integrated circuit substrate including the conductive line and the first and second diodes, such that the first and second diodes dissipate both positive and negative charges on the conductive line during the plasma processing. Then, one of the first and second diodes is disconnected from the conductive line after performing the plasma processing, to thereby allow conduction of one of positive and negative charge on the conductive line after performing the plasma processing.

5 Claims, 7 Drawing Sheets

INTEGRATED CIRCUIT DEVICES THAT USE ANTIPARALLEL DIODES TO REDUCE DAMAGE DURING PLASMA PROCESSING

FIELD OF THE INVENTION

This invention relates to integrated circuit devices and fabrication methods, and more particularly to integrated circuit devices and fabrication methods that use plasma processing.

BACKGROUND OF THE INVENTION

Plasma processing is widely used in fabricating integrated circuit devices. Plasma processing may include dry etching, thin film deposition, ashing and blanket etching. In particular, dry etching is widely used in fabricating highly integrated devices because anisotropic etching may be produced, to thereby allow submicron devices to be formed.

Unfortunately, plasma processing may also produce undesirable damage in the integrated circuit device. More particularly, since the plasma comprises a mix of charged particles, the particles may undesirably accumulate on certain surfaces. Thus, a conductive line such as a gate electrode of an integrated circuit field effect transistor may accumulate undesired charges thereon during plasma processing. The plasma charges may flow toward the edge of the conductive line in an effect known as the "antenna effect", and thereby damage an underlying insulator. Integrated circuit field effect transistors may be particularly susceptible to this damage because the insulated gate electrode thereof generally includes a very thin gate insulating layer between the gate electrode and the surface of the integrated circuit. This gate insulator damage may degrade the properties of the field effect transistor and/or reduce the yield of the integrated circuit manufacturing process. Moreover, the degraded performance may not become apparent until after the integrated circuit is placed in the field, thereby degrading the reliability to the end user.

In order to reduce plasma processing damage, it is known to connect a junction diode to a conductive line such as a gate electrode on an integrated circuit substrate. Thus, for an NMOS transistor, it is known to add an NP diode and for a PMOS transistor it is known to add a PN diode, to thereby allow the charges generated on the conductive line during the plasma process to dissipate into the integrated circuit substrate through the junction diode. The addition of a junction diode to reduce plasma processing damage is illustrated in FIGS. 1–4.

FIGS. 1–3 are top and cross-sectional views of a conventional integrated circuit device that includes a diode to reduce plasma processing damage. FIG. 2 is a cross-sectional view of FIG. 1 taken along the line 2–2' and FIG. 3 is a cross-sectional view of FIG. 1 taken along the line 3–3'.

Referring to FIGS. 1–3, a conventional integrated circuit field effect transistor, such as an NMOS transistor, includes a well 12 of first conductivity type, here p-type, in an integrated circuit substrate such as a silicon semiconductor substrate 10. A field oxide layer 14 is formed in the integrated circuit substrate. A gate insulating layer 16 is formed on the face of the integrated circuit substrate. A gate electrode such as an L-shaped gate electrode 18 is formed. The gate electrode 18 may include sidewall spacers 20. Spaced apart source and drain regions 22 of second conductivity type, here n-type, are formed on opposite sides of the gate electrode 18. A second conductivity type bulk region 24 may be included in the first conductivity type well 12. A junction diode is formed by forming a second conductivity type region 26, here n-type, in the first conductivity type well 12.

Continuing with the description of FIGS. 1–3, an interlayer insulating layer 28 is formed on the integrated circuit substrate, including on the gate electrode 18. The interlayer insulating layer 28 includes contact holes therein that individually expose the bulk region 24, the source/drain regions 22, the second conductivity type region 26 of the junction diode, and the gate electrode 18 on the field oxide layer 14. Conductive plugs such as tungsten plugs 30 are formed in the contact holes. A first metallization line 32a is formed on the interlayer insulating layer 28 opposite the integrated circuit substrate 10 and is connected to the gate electrode 18 and the second conductivity type region 26 of the junction diode. A plurality of second metallization lines 32b are formed to individually connect the bulk region 24, the source/drain regions 22 and the second conductivity type region 26 of the junction diode via the conductive plugs 30. A second insulating layer 34 is then formed on the interlayer insulating layer 28 including on the first and second metallization lines 32a and 32b.

FIG. 4 is an equivalent circuit of the integrated circuit device of FIGS. 1–3. As shown in FIG. 4, the gate electrode G of the NMOS transistor is electrically connected to the NP junction diode by the first metallization line 32a (FIGS. 1 and 3). Plasma charges that are generated during plasma processing therefore flow into the substrate through the diode. Thus, when plasma processing is performed in order to form the gate electrode, plasma charges can flow into the substrate through the junction diode, thereby reducing damage from the plasma.

Unfortunately, the use of a junction diode that is connected to a conductive line such as a gate electrode may not prevent all plasma processing-induced damage to the underlying insulator. As the integration density of integrated circuit devices continues to increase, and the thickness of the gate insulator continues to decrease, this remaining plasma processing damage may continue to impact the performance, yield and/or reliability of the integrated circuit devices.

SUMMARY OF THE INVENTION

It is therefore an object of the present invention to provide improved integrated circuit devices and fabrication methods therefor.

It is another object of the present invention to provide integrated circuits and fabrication methods that can reduce damage during plasma processing.

It is another object of the present invention to provide integrated circuit devices and fabrication methods that can reduce damage during plasma processing compared to devices that include a diode connected to a conductive line.

These and other objects are provided according to the present invention by an integrated circuit that includes first and second diodes that are electrically connected to a conductive line in antiparallel, to dissipate both positive and negative charges on the conductive line during plasma processing. The integrated circuit also includes means for disconnecting one of the first and second diodes from the conductive line after the plasma processing, to thereby allow conduction of one of positive and negative charge on the conductive line after the plasma processing.

It has been found, according to the present invention, that although the use of a single diode may allow one of the positive and negative charges to dissipate into the substrate, the other of the positive and negative charges does not dissipate into the substrate, because the diode prevents flow of the other of the positive and negative charges. For example, for an NP diode, negative charges can flow freely toward the substrate from the conductive line, but positive charges do not flow. Thus, the positive charges can damage the underlying insulating layer. The same phenomenon may take place when a PN diode is connected to the gate electrode of a PMOS transistor, except that positive charges flow into the substrate but negative charges are trapped.

In sharp contrast, the present invention allows both positive and negative charges to flow from the conductive line into the substrate during plasma processing. After plasma processing, one of the first and second diodes is disconnected so that only one type of charge, such as negative charge, is conducted on the conductive line during normal operation of the integrated circuit. Thus, normal operation of the integrated circuit need not be degraded.

Accordingly, integrated circuits are fabricated according to the present invention by forming a conductive line on an integrated circuit substrate and first and second diodes in the integrated circuit substrate that are electrically connected to the conductive line in antiparallel. Then, plasma processing is performed on the integrated circuit substrate including the conductive line and the first and second diodes, such that the first and second diodes dissipate both positive and negative charges on the conductive line during the plasma processing. Then, one of the first and second diodes is disconnected from the conductive line after performing the plasma processing, to thereby allow conduction of one of positive and negative charge on the conductive line after performing the plasma processing.

Many conventional techniques may be used to disconnect the one of the first and second diodes from the conductive line after plasma processing. However, preferably, a fuse is provided that electrically connects the one of the first and second diodes to the conductive line. The fuse may be provided by reducing the width of the conductor that electrically connects the one of the first and second diodes to the conductive line. The fuse may be activated by current/voltage, by laser or by other conventional means.

More specifically, integrated circuits according to the present invention include an integrated circuit substrate having a first well of first conductivity type and a second well of second conductivity type at a face thereof. Spaced apart source and drain regions are included in the first well, at the face. An insulated gate electrode is included on the face between the spaced apart source and drain regions. A first region of second conductivity type is included in the first well. The first region and the first well form a first junction diode. A second region of first conductivity type is included in the second well. The second region and the second well form a second junction diode. A conductive structure extends between the insulated gate electrode, the first region and the second region, to thereby electrically connect the insulated gate electrode, the first region and the second region to one another. The conductive structure between the first and second regions includes a narrow portion relative to the conductive structure between the first region and the insulated gate electrode. An insulating layer also may be provided on the conductive structure, opposite the integrated circuit substrate. The insulating layer may include a hole that exposes the narrow portion. The first and second wells preferably are adjacent one another to define a boundary therebetween, and the narrow portion preferably extends across the boundary.

In more detail, the conductive structure preferably comprises an interlayer insulating layer on the first and second wells and on the insulated gate electrode, and first, second and third conductive plugs that extend through the interlayer insulating layer, to electrically contact the insulated gate electrode, the first region and the second region, respectively. A metallization line is provided on the interlayer insulating layer that electrically connects the first, second and third conductive plugs. The metallization line between second and third conductive plugs includes a narrow portion relative to the metallization line between the first and second plugs. A second insulating layer may be provided on the metallization line opposite the interlayer insulating layer. The second insulating layer may include a hole therein that exposes the narrow portion.

Thus, plasma processing is performed on the integrated circuit substrate including the conductive structure and the first and second diodes, such that the first and second diodes dissipate both positive and negative charge on the conductive line during the plasma processing. The narrow portion is then opened after performing the plasma prqcessing, to thereby disconnect the second junction diode from the insulated gate electrode after performing the plasma processing. Improved integrated circuit devices and fabrication methods may thereby be provided that can reduce and preferably eliminate damage that is caused by positive and negative charged particles that accumulate on conductive lines during plasma processing.

DETAILED DESCRIPTION OF PREFERRED EMBODIMENTS

Figure 1:
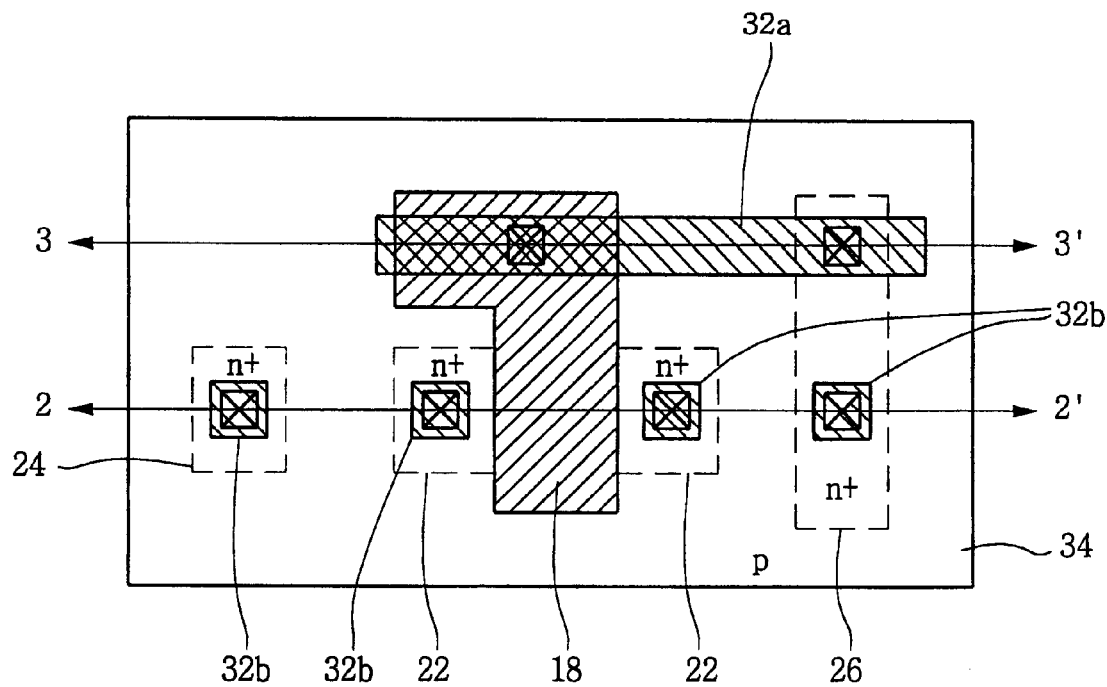
FIG. 1 is a top view of a conventional integrated circuit device.
Figure 2:
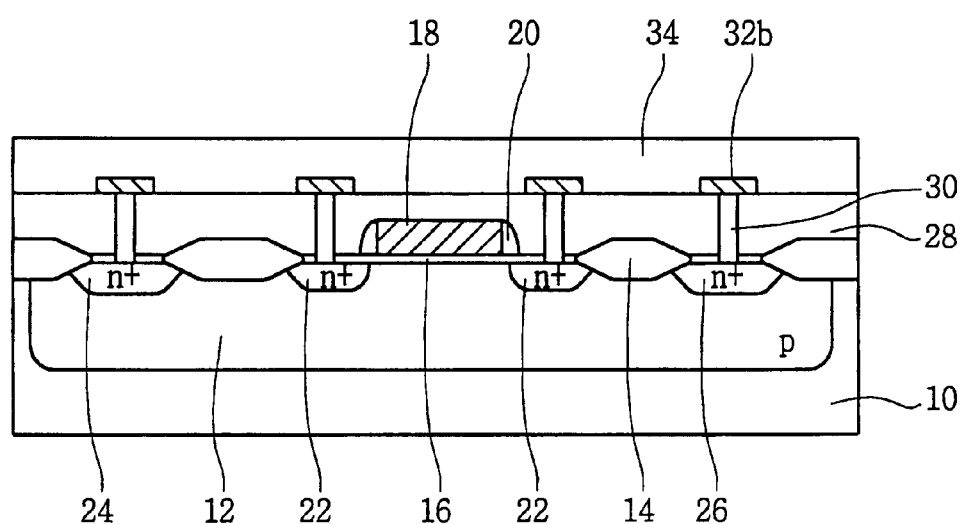
FIG. 2 is a cross-sectional view of FIG. 1 taken along the line 2–2'.
Figure 3:
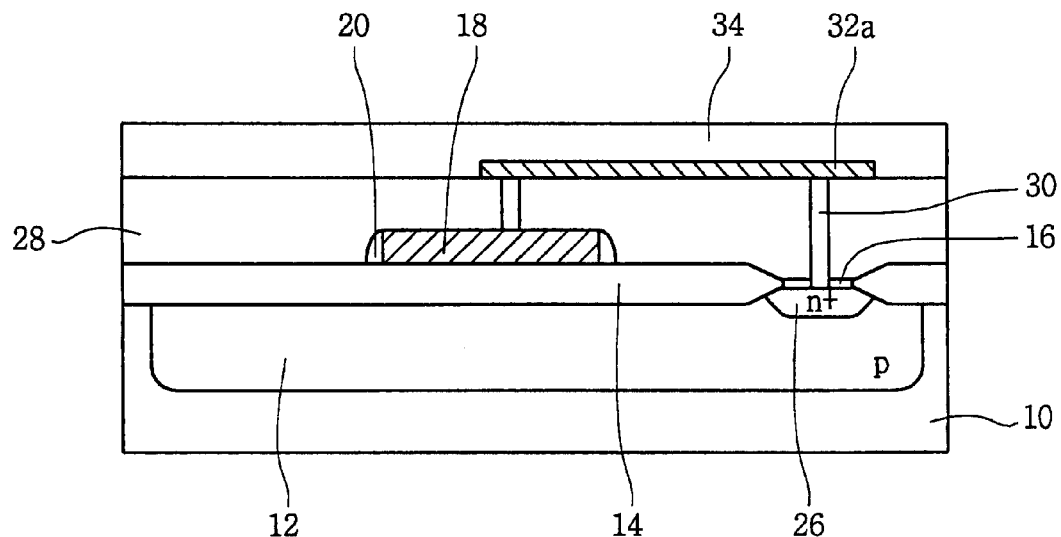
FIG. 3 is a cross-sectional view of FIG. 1 taken along the line 3–3'.
Figure 4:
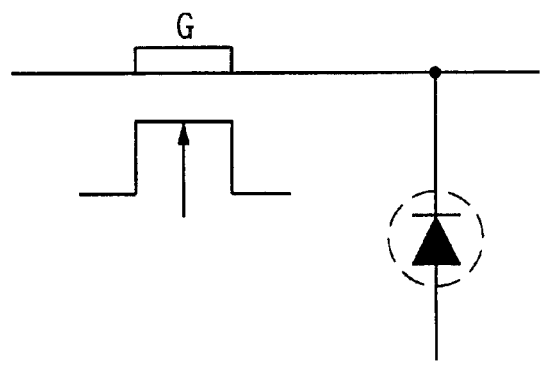
FIG. 4 is an equivalent circuit diagram of FIG. 1.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

The present invention provides integrated circuit devices wherein at least two diodes are connected to a conductive line in antiparallel so that both positive and negative plasma charges can freely flow into the substrate during plasma processing.

Deterioration of a gate insulating layer as a result of accumulated charge may therefore be minimized. Moreover, after performing plasma processing, one of the first and second diodes is disconnected so that normal conduction may take place on the conductive line in the integrated circuit.

Figure 5:
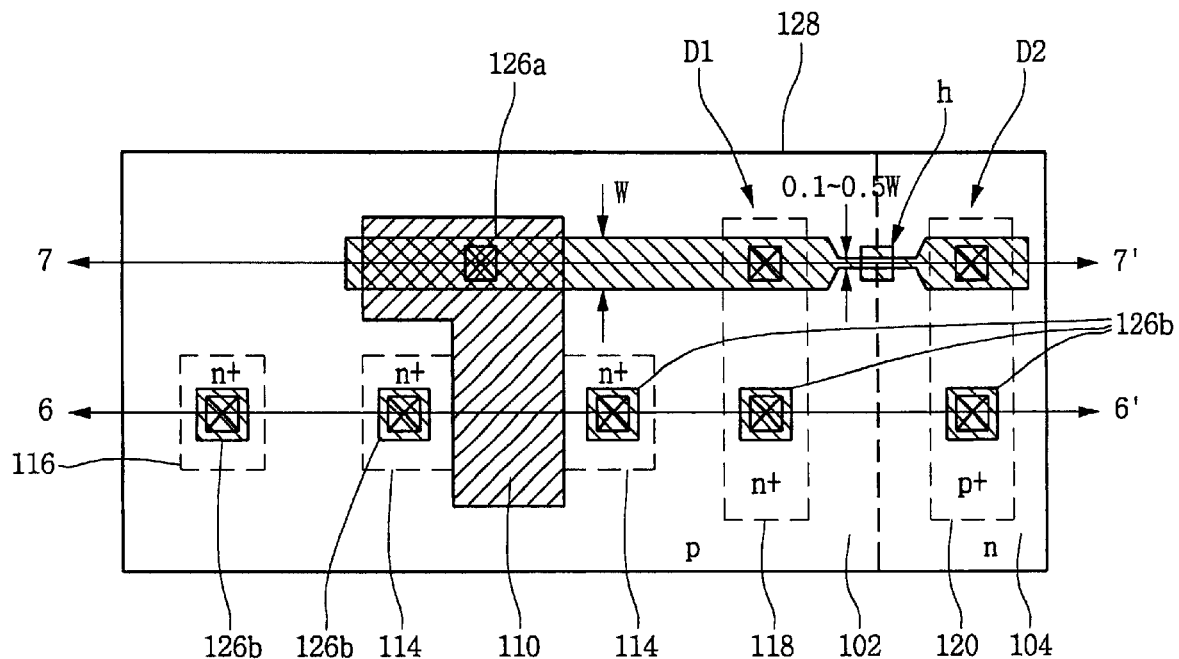
FIG. 5 is a top view of integrated circuit devices according to the present invention.
Figure 6:
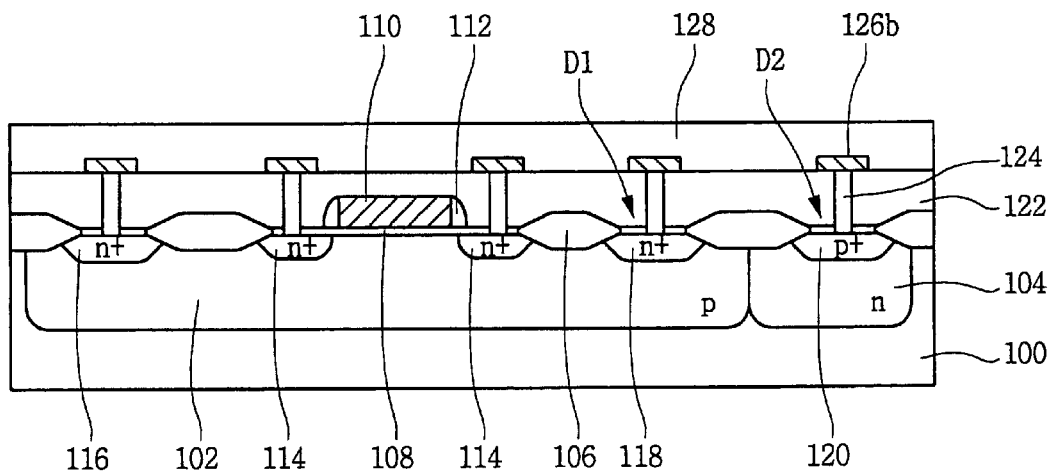
FIG. 6 is a cross-sectional view of FIG. 5 taken along the line 6–6'.
Figure 7:
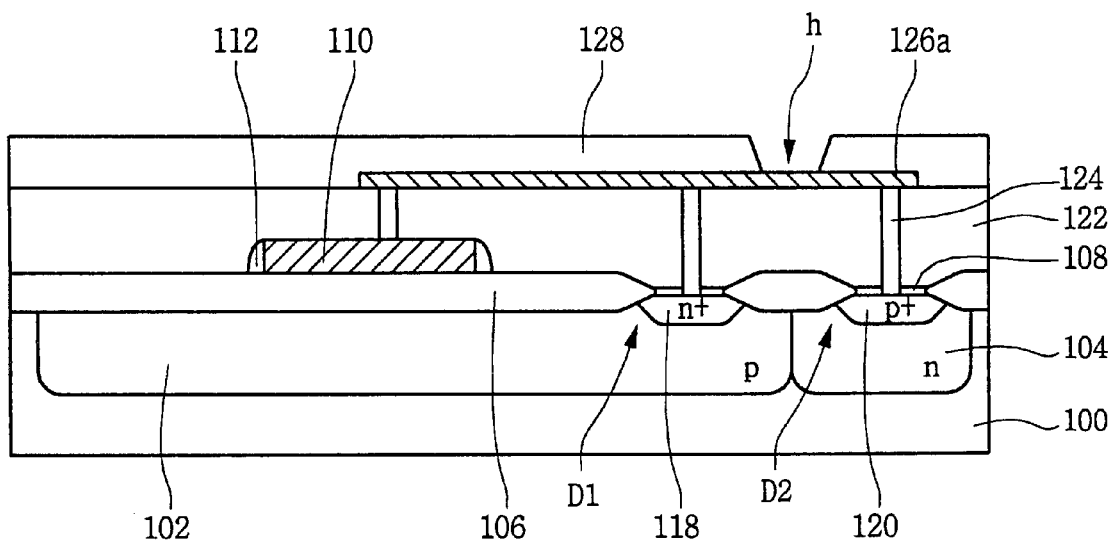
FIG. 7 is a cross-sectional view of FIG. 5 taken along the line 7–7'.

FIGS. 5–7 are top and cross-sectional views of integrated circuit devices according to the present invention. FIG. 5 is a top view of integrated circuit devices according to the invention. FIG. 6 is a cross-sectional view of FIG. 5 taken along the line 6–6 '. FIG. 7 is a cross-sectional view of FIG. 5 taken along 7–7 '. FIGS. 5–7 will be described relative to an NMOS integrated circuit field effect transistor. However, the present invention can also apply to PMOS transistors with conductivity types reversed from those shown. Moreover, the present invention can apply to any conductive line in an integrated circuit, including but not limited to gate electrodes.

Referring now to FIGS. 5–7, integrated circuit devices according to the present invention include a first well 102, here p-type and a second well 104, here n-type, in an integrated circuit substrate, such as a silicon semiconductor substrate 100. A field oxide layer 106 is formed to define active regions of the integrated circuit. A gate insulating layer 108 is formed on the active region at the face of the substrate 100. A conductive line such as an L-shaped gate electrode 110 is formed on the gate insulating layer 108. A gate sidewall spacer 112 may also be provided. Spaced apart source and drain regions 114 of second conductivity type, here n-type, are provided in the first conductivity type well 112 on opposite sides of the gate electrode 110. A second conductivity type bulk region 116 may be formed in the first conductivity type well 102.

A first region 118 of second conductivity type, here n-type, is formed in the first conductivity type well 102, so that the first region 118 and the first well 102 form a first junction diode D1. Moreover, according to the present invention, a second region 120 of second conductivity type, here p-type, is provided in the second well 104. The second region 120 and the second well 104 form a second junction diode D2.

Continuing with the descriptions of FIGS. 5, 6 and 7, an interlayer insulating layer 112 is formed on the integrated circuit substrate including on the gate electrode 110. The interlayer insulating layer includes a plurality of contact holes to expose the source/drain regions 114, the gate electrode 110 and the first and second regions 118 and 120 respectively. A plurality of conductive plugs 124, such as tungsten plugs, are formed in the contact holes. A first metallization line 126a is provided on the interlayer insulating layer 122 opposite the integrated circuit substrate 100 and is connected to the gate electrode 110 and to the first and second regions 118 and 120 through the conductive plugs 124. Accordingly, the conductive plugs 124 and the first metallization line 126a form an embodiment of a conductive structure that extends between the gate electrode, the first region and the second region, to thereby electrically connect the insulated gate electrode, the first region and the second region to one another. A plurality of second metallization lines 126b are also provided on the interlayer insulating layer, to individually contact the bulk region 116, the source/drain regions 114 and the first and second junction diodes through the conductive plugs 124.

A second insulating layer 122 is formed on the first and second metallization lines 126a and 126b. As shown in FIG. 7, the second insulating layer 128 includes a hole h therein that exposes a predetermined portion of the first metallization line 126a. The exposed portion preferably extends across the boundary between the first and second conductivity type wells 102 and 104 respectively.

As shown in FIG. 5, the conductive structure between the first and second regions 118 and 120 includes a narrow portion relative to the conductive structure between the first region 118 and the insulated gate electrode 110. For example, if the conductive structure between the first region and the insulated gate electrode is of width W, then the narrow portion may be of width between about 0.1W and about 0.5W. As shown in FIG. 7, the hole h exposes the narrow portion. The hole h is preferably located on the boundary between the first and second wells. The narrow portion acts as a fuse that can be used to disconnect the second diode D2 from the conductive line 110 after plasma processing, to thereby allow conduction of positive charges in gate electrode 110 without dissipating the positive charges into the substrate 100.

Figure 8:
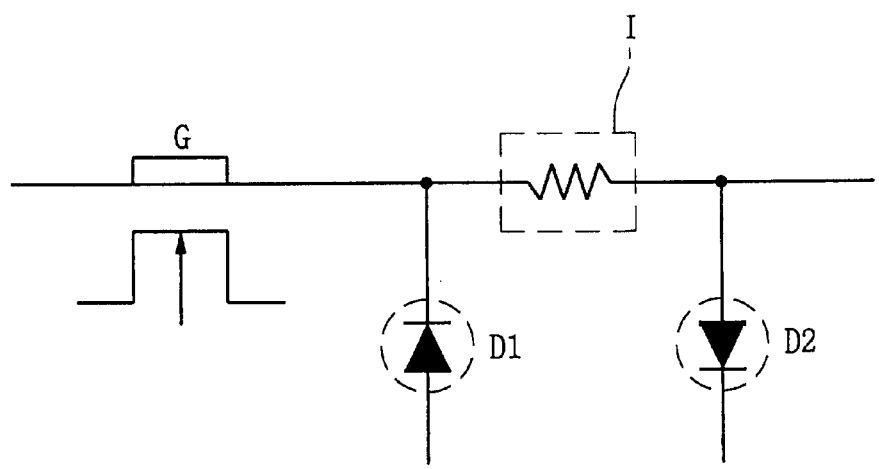
FIG. 8 is an equivalent circuit diagram of FIG. 5.

FIG. 8 is an equivalent circuit of an integrated circuit of FIGS. 5–7. As shown, the first and second diodes D1 and D2 are electrically connected to the gate electrode G of the integrated circuit field effect transistor. Reference letter I designates the fuse in the first metallization line 126a. As shown, the fuse I is included in the conductive structure between the first and second diodes D1 and D2 so that the second diode D2 may be disconnected after plasma processing is performed, to thereby allow conduction of positive charge on the gate electrode G, so that the integrated circuit field effect transistor may operate properly. It will also be understood that other techniques for disconnecting the diode D2 may be used, such as the placement of a switch between diodes D1 and D2. Moreover, fuses may be provided using techniques other than by providing a narrow portion in the conductive structure. For example, a fuse may be provided by using differing materials in the conductive structure with high and low resistivities.

Figure 9A:
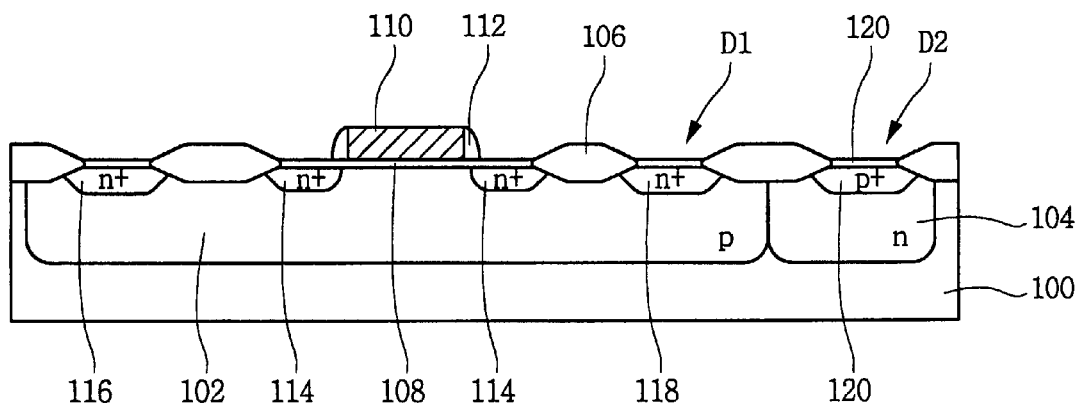
FIGS. 9a–9c illustrate an integrated circuit device of FIG. 6 during intermediate fabrication steps.
Figure 9B:
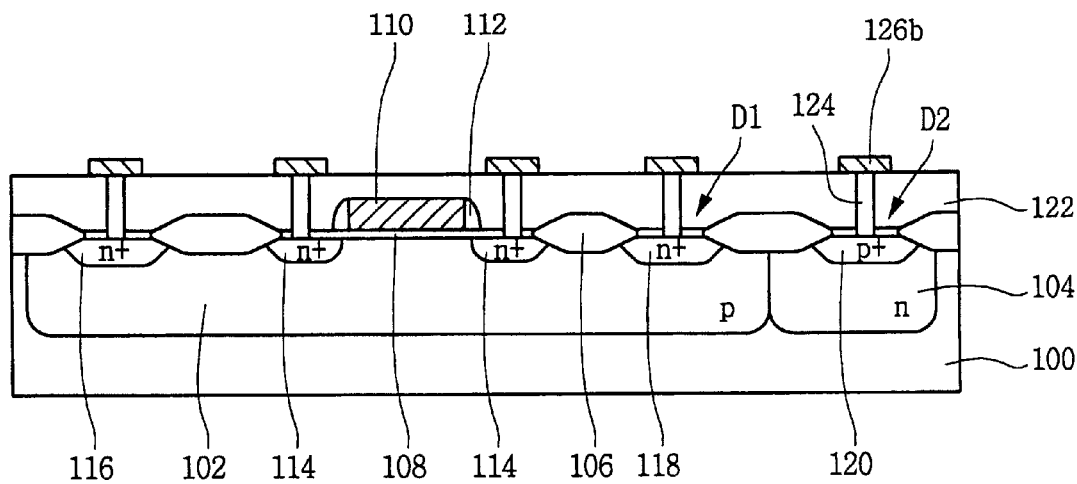
Figure 9C:
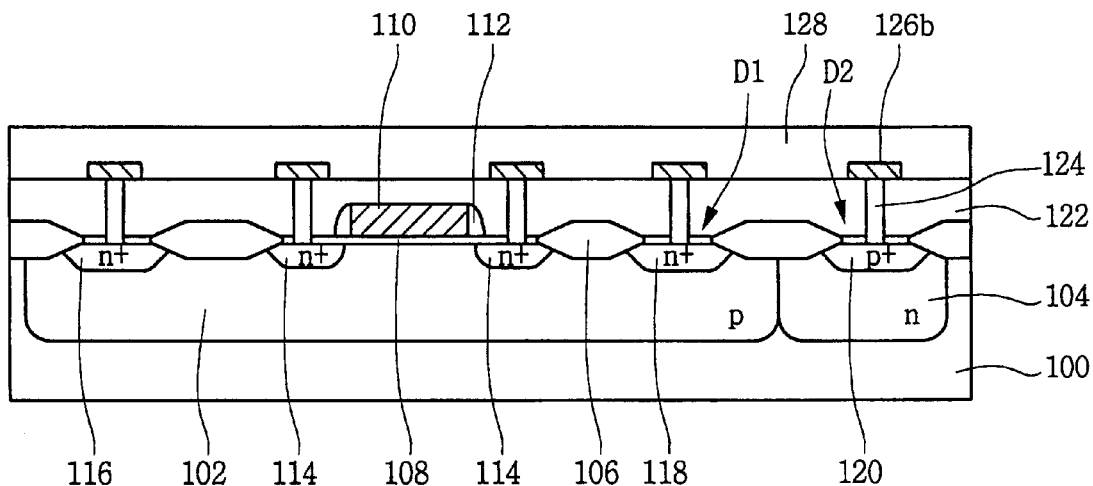
Figure 10A:
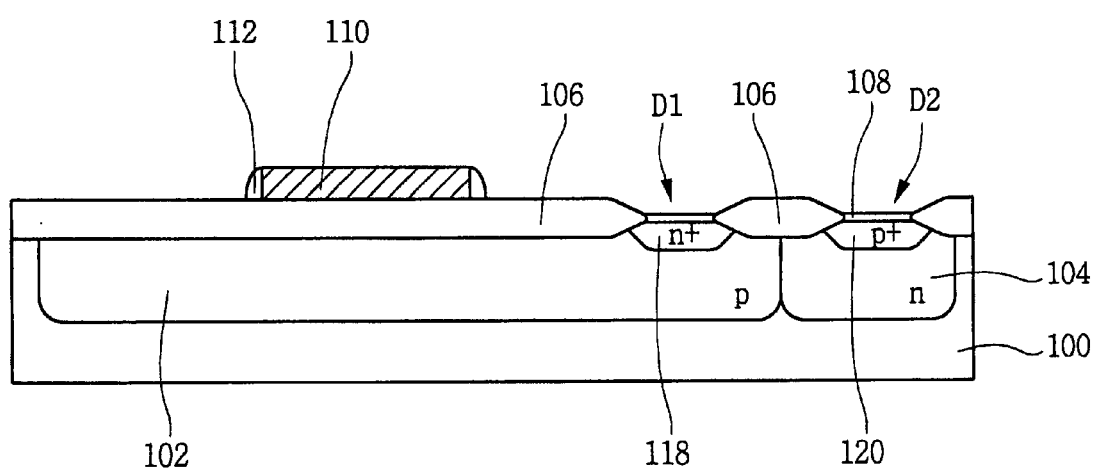
FIGS. 10a–10c illustrate an integrated circuit device of FIG. 7 during intermediate fabrication steps.
Figure 10B:
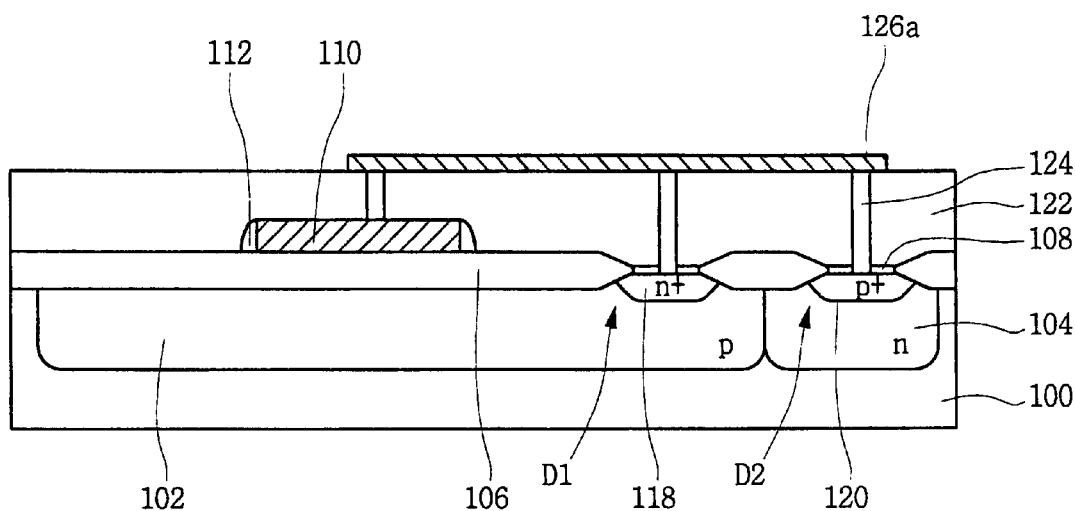
Figure 10C:
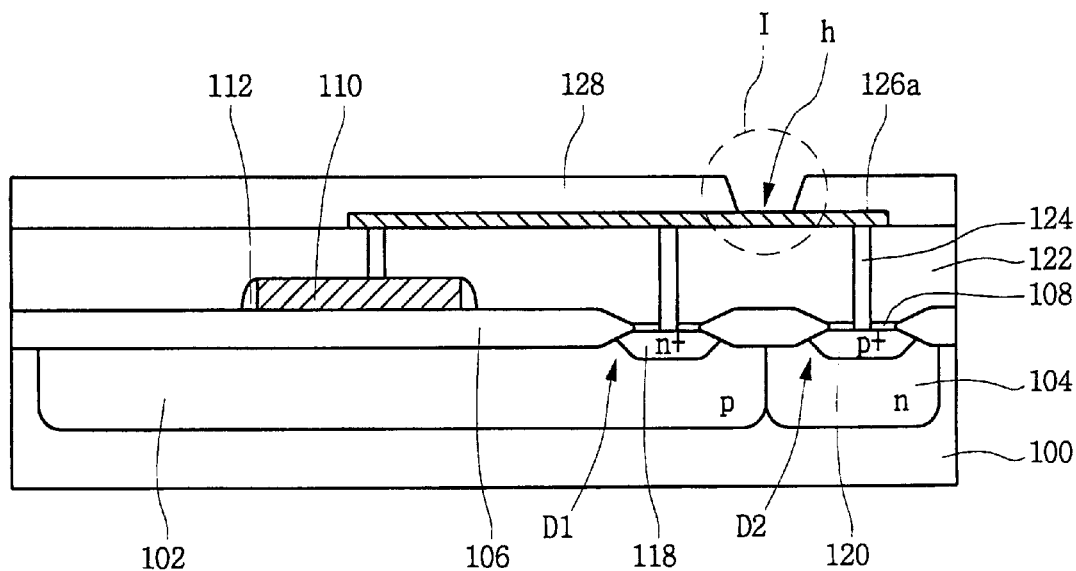

FIGS. 9a–9c and 10a–10c illustrate the structure of FIGS. 6 and 7 respectively during intermediate fabrication steps. FIGS. 9a–9c illustrate a cross-sectional view through line 6–6' of FIG. 5 during intermediate fabrication steps and FIGS.10a–10c illustrate a cross-sectional view through line 7–7' of FIG. 5 during intermediate fabrication steps.

Referring now to FIGS. 9a and 10a, first conductivity type, here p-type, and second conductivity type, here n-type, ions, are implanted into the face of an integrated circuit substrate such as a semiconductor silicon substrate 100, to form the first and second conductivity type wells 102 and 104. The field oxide layer 106 is formed on the substrate 100 to define active regions and inactive regions, and the gate insulating layer 108 is formed on the active region. A conductive layer, for example polysilicon or polycide, formed on the integrated circuit substrate and then selectively etched to form the gate electrode 110 in the shape of a reverse L. Lightly doped second conductivity type dopants are implanted into the substrate using the gate electrode as a mask. A spacer 112 comprising silicon nitride is formed on the sidewall of the gate electrode 110. Heavily doped second conductivity type ions are then selectively implanted into the substrate using the gate and sidewall spacers as a mask. Accordingly, the source and drain regions 114 include lightly doped and heavily doped portions.

Still referring to FIGS. 9a and 10a, the second conductivity type bulk region 116 is formed in the first conductivity type well 102. The first region 118 of second conductivity type is formed in the first conductivity type well 102. It will be understood by those having skill in the art that each of the above-described fabrication steps for forming an integrated circuit field effect transistor and a diode connected to the gate thereof are well known to those having skill in the art. Many variations in these steps are also well known to those having skill in the art.

A heavily doped first conductivity type dopant is selectively implanted to the second conductivity type well 104 in order to form the second region 120 in the second well 104. The individual steps for forming the second well 104 and the second region 120 are also well known to those having skill in the art and may be performed at various points in the fabrication process of the integrated circuit field effect transistor. Accordingly, FIGS. 9a and 10a illustrate the step of forming spaced apart source and drain regions in the first well, at the face of the integrated circuit substrate, an insulated gate electrode on the face between the spaced apart source and drain regions, a first region of second conductivity type in the first well, the first region and the first well forming a first junction diode, and a second region of first conductivity type in the second well, the second region and the second well forming a second junction diode.

Referring now to FIGS. 9b and 10b, steps for forming a conductive structure that extends between the insulated gate electrode, the first region and the second region, to thereby electrically connect the insulated gate electrode, the first region and the second region to one another, are illustrated. The interlayer insulating layer 122, for example an oxide layer, is deposited on the integrated circuit and planarized. The interlayer insulating layer 122 is then selectively etched to expose determined portions of the bulk region 116, the source/drain regions 114 and the first and second regions 118 and 120, thereby forming a plurality of contact holes therein.

A conductive layer of tungsten, aluminum, copper and/or combinations or alloys thereof is formed on the interlayer insulating layer 122 including in the contact holes. A chemical-mechanical polish or other etch-back process is then performed to form the conductive plugs 124. A first metallization is then formed on the interlayer insulating layer 122 including on the conductive plugs and selectively etched to form the first metallization line 126a that connects the gate electrode 110 and the first and second regions 118 and 120 through their conductive plugs and a plurality of second metallization lines 126b that are individually connected to the bulk region 116 and the source/drain regions 114 through their respective conductive plugs. It will be understood by those having skill in the art that the conductive plugs 124 and the metallization lines 126a and 126b may also be formed of the same metal in a single deposition and selective etching step.

It will also be understood that if the conductive plugs 124 comprise tungsten, a multilayer metal barrier layer comprising for example titanium and titanium nitride also may be formed in the contact hole. Alternatively, if the plugs comprise copper or copper alloys, a metal barrier layer of titanium nitride (WxNy) may be deposited therein.

Referring to FIGS. 9c and 10c, the second insulating layer 128, for example an oxide layer, is deposited on the interlayer insulating layer 122 including the first and second metallization lines 126a and 126b. The second insulating layer 128 may then be selectively etched to expose a predetermined portion of the first metallization line 126a, preferably at the boundary between the first and second conductivity type wells 102 and 104, to thereby form the hole h in the second insulating layer 128.

As shown in FIG. 5, the first metallization line 126a has a width W on the first and second conductivity type wells 102 and 104, and a width of about 0.1W to about 0.5W at the boundary line between the first and second wells 102 and 104.

Stated differently, the conductive structure between the first and second regions 118 and 120 includes a narrow portion relative to the conductive structure between the first region 118 and the insulated gate electrode 110. The first metallization line preferably has a narrow portion that is exposed by the hole h so that the narrow portion can operate as a fuse I. The fuse may be opened using a laser. Alternatively, the fuse may be opened using current/voltage. Specifically, in the initial stage of electrostatic discharge testing, a relatively high voltage may be applied to the first metallization line 126a, which thereby melts the narrow portion I. Other techniques of opening the fuse may be used.

If the second diode D2 was to remain in the circuit after plasma processing is performed, when the integrated circuit is operational, the performance of the integrated circuit field effect transistor may be degraded because both positive and negative charge may be dissipated from the gate electrode 110 into the substrate 100. Therefore, the second diode D2 is removed from the circuit by blowing the fuse I so that positive charge does not dissipate into the substrate, but remains on the gate electrode 110.

In other words, when performing plasma processing on the integrated circuit substrate, the negative plasma charge is dissipated into the substrate through the first diode D1 and the positive plasma charge is dissipated into the substrate through the second diode D2. Thus, neither positive charge nor negative charge is trapped in the insulating layer 108 during plasma processing. Accordingly, the performance, yield and/or reliability of the integrated circuit may be increased. After plasma processing, operation of the integrated circuit field effect transistor may be degraded by positive charge dissipating into the substrate through diode D2. Accordingly, diode D2 is removed from the circuit by the operation of fuse I. It will be understood that diode D1 can also be removed from the circuit by the operation of another fuse. Alternatively, a single fuse may be used to remove both diodes D1 and D2 from the circuit.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit comprising:
  an integrated circuit substrate including therein a first well of first conductivity type and a second well of second conductivity type at a face thereof;
  spaced apart source and drain regions in the first well, at the face;
  an insulated gate electrode on the face between the spaced apart source and drain regions;
  a first region of second conductivity type in the first well, the first region and the first well defining a first junction diode;

a second region of first conductivity type in the second well, the second region and the second well defining a second junction diode;

an interlayer insulating layer on the first and second wells and on the insulated gate electrode;

first, second and third conductive plugs that extend through the interlayer insulating layer to electrically contact the insulated gate electrode, the first region and the second region, respectively; and a metallization line on the interlayer insulating layer and electrically connecting the first, second and third conductive plugs, the metallization line between the second and third conductive plugs including a narrow portion relative to the metallization line between the first and second conductive plugs;

wherein the first and second wells are adjacent one another to define a boundary therebetween and wherein the narrow portion extends across the boundary.

2. An integrated circuit according to claim 1 further comprising a second insulating layer on the metallization line, opposite the interlayer insulating layer, the second insulating layer including therein a hole that extends across the boundary and that exposes the narrow portion.

3. An integrated circuit according to claim 1 wherein the narrow portion comprises a fuse in the metallization line.

4. An integrated circuit according to claim 3 wherein the fuse is a voltage or current activated fuse.

5. An integrated circuit according to claim 3 wherein the fuse is a laser activated fuse.

* * * * *